United States Patent
Lee et al.

(10) Patent No.: US 8,816,216 B2
(45) Date of Patent: Aug. 26, 2014

(54) ENCAPSULATION SUBSTRATE FOR ORGANIC LIGHT EMITTING DIODE DISPLAY AND METHOD OF MANUFACTURING THE ENCAPSULATION SUBSTRATE

(75) Inventors: Choong-Ho Lee, Yongin (KR); Jung-Min Lee, Yongin (KR); Kie-Hyun Nam, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 332 days.

(21) Appl. No.: 13/208,573

(22) Filed: Aug. 12, 2011

(65) Prior Publication Data

US 2012/0061131 A1 Mar. 15, 2012

(30) Foreign Application Priority Data

Sep. 14, 2010 (KR) .................... 10-2010-0089924

(51) Int. Cl.
*H05K 1/09* (2006.01)

(52) U.S. Cl.
USPC ............ 174/257; 174/254; 29/829; 428/138; 438/618; 156/90; 165/182

(58) Field of Classification Search
USPC ................... 174/257, 254; 29/829; 428/138; 438/618; 156/90; 165/182
See application file for complete search history.

(56) References Cited

U.S. PATENT DOCUMENTS

| | | | | |
|---|---|---|---|---|
| 5,370,921 A | * | 12/1994 | Cedarleaf | 428/138 |
| 5,397,618 A | * | 3/1995 | Cedarleaf | 428/138 |
| 5,470,413 A | * | 11/1995 | Cedarleaf | 156/90 |
| 6,998,776 B2 | | 2/2006 | Aitken et al. | |
| 7,537,504 B2 | | 5/2009 | Becken et al. | |
| 2002/0025416 A1 | | 2/2002 | Uchibori | |
| 2005/0277282 A1 | * | 12/2005 | Horikawa et al. | 438/618 |
| 2007/0092709 A1 | | 4/2007 | Okamoto et al. | |
| 2008/0149900 A1 | * | 6/2008 | Jang et al. | 252/511 |
| 2008/0268318 A1 | * | 10/2008 | Jang et al. | 429/34 |
| 2009/0107702 A1 | * | 4/2009 | Samejima et al. | 174/254 |
| 2009/0195147 A1 | | 8/2009 | Song et al. | |
| 2011/0290408 A1 | * | 12/2011 | Samejima et al. | 156/182 |

FOREIGN PATENT DOCUMENTS

| | | |
|---|---|---|
| JP | 2001-209050 | 8/2001 |
| KR | 1996-0021510 | 7/1996 |

(Continued)

*Primary Examiner* — Xiaoliang Chen
(74) *Attorney, Agent, or Firm* — Robert E. Bushnell, Esq.

(57) ABSTRACT

A method of manufacturing an encapsulation substrate for an organic light emitting diode display, includes fabricating a composite panel by forming an uncured carbon fiber resin portion having a plate shape and including an upper surface and a lower surface and forming an uncured insulating resin portion arranged to surround edges of the carbon fiber resin portion, the uncured insulating resin portion being perforated by a plurality of penetration holes, inserting a plurality of conductive components into corresponding ones of the plurality of penetration holes, covering upper and lower surfaces of the composite panel with metal films and bonding the metal films to the composite panel while simultaneously curing the carbon fiber resin and the insulating resin portion by applying heat and pressure to the composite panel. Therefore, fabrication processes of the encapsulation substrate are simple, and fabrication costs are reduced.

20 Claims, 11 Drawing Sheets

(56) References Cited

FOREIGN PATENT DOCUMENTS

| KR | 10-0403260 | 10/2003 |
| KR | 10-0494171 | 5/2005 |
| KR | 10-2005-0067364 | 7/2005 |
| KR | 10-0625592 | 9/2006 |
| KR | 10-2007-0030352 | 3/2007 |
| KR | 10-2007-0045095 | 5/2007 |
| KR | 10-0870517 | 11/2008 |

\* cited by examiner

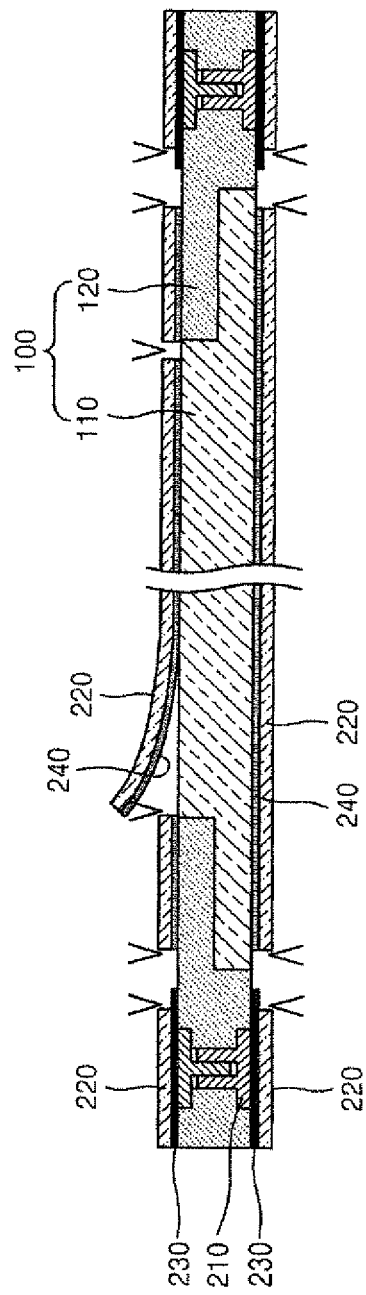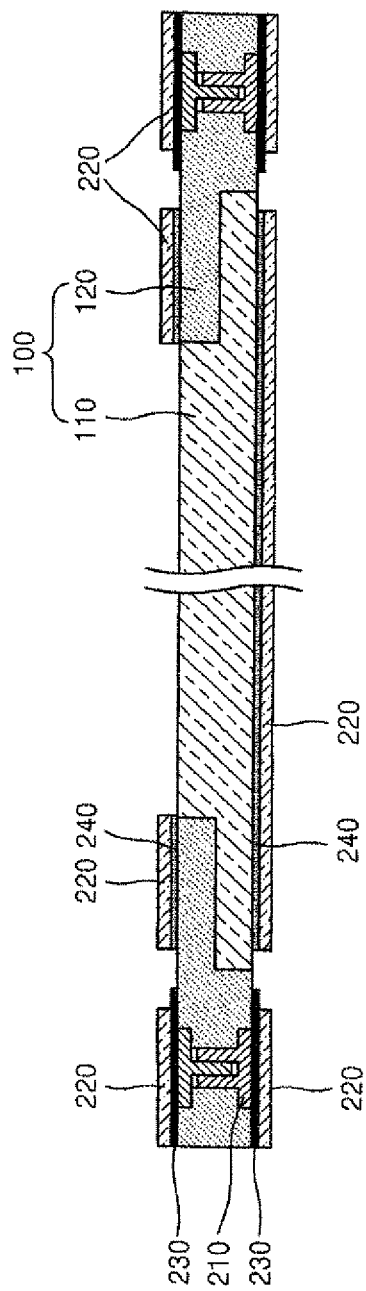

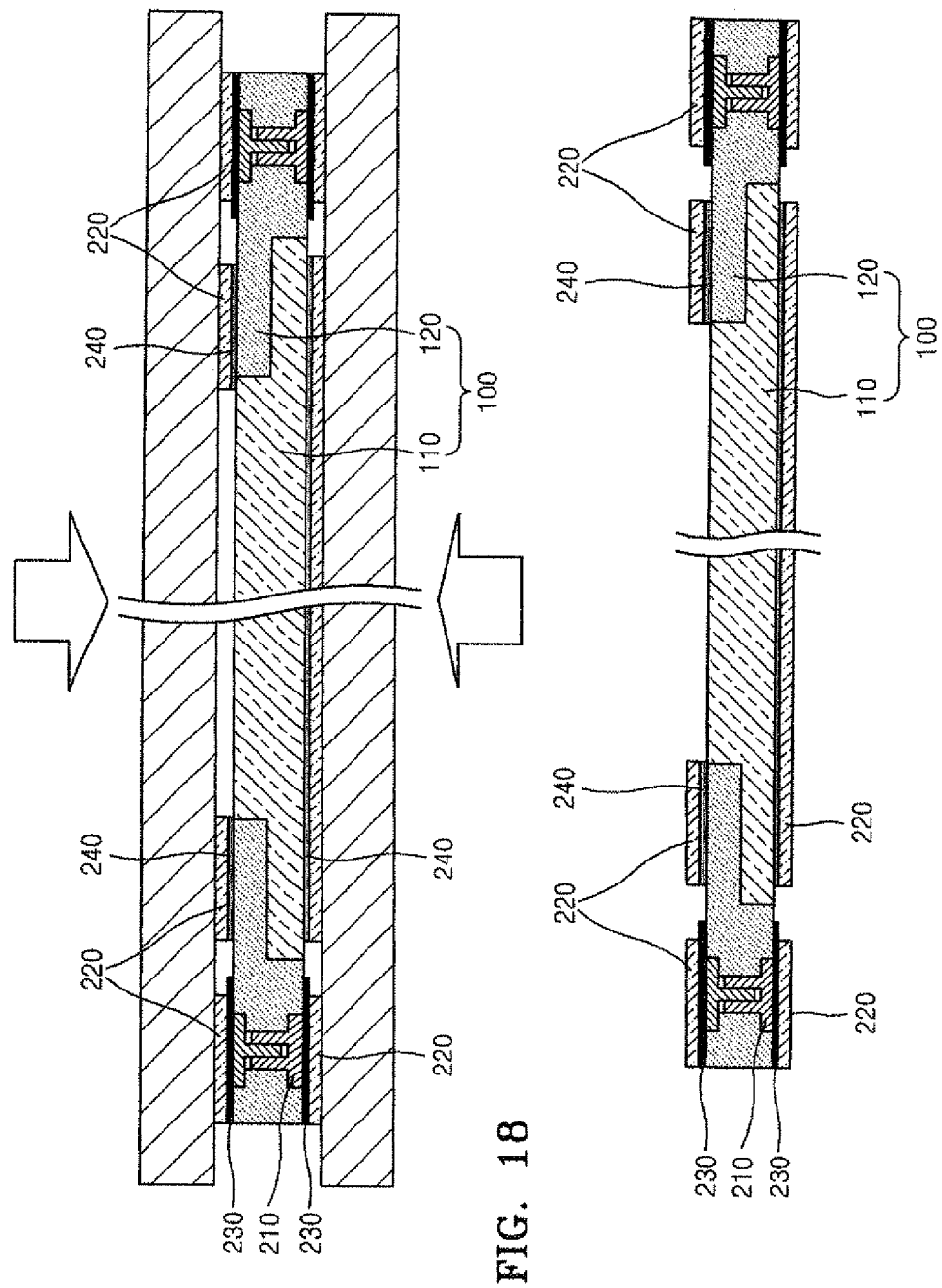

ENCAPSULATION SUBSTRATE FOR ORGANIC LIGHT EMITTING DIODE DISPLAY AND METHOD OF MANUFACTURING THE ENCAPSULATION SUBSTRATE

CLAIM OF PRIORITY

This application makes reference to, incorporates the same herein, and claims all benefits accruing under 35 U.S.C. §119 from an application for ENCAPSULATION SUBSTRATE FOR ORGANIC LIGHT EMITTING DIODE DISPLAY AND METHOD OF MANUFACTURING THE ENCAPSULATION SUBSTRATE earlier filed in the Korean Intellectual Property Office on 14 Sep. 2010 and there duly assigned Serial No. 10-2010-0089924.

BACKGROUND OF THE INVENTION

1. Field of the Invention

The present invention relates to an encapsulation substrate for an organic light emitting diode display and a simple and low cost method of manufacturing the same.

2. Description of the Related Art

An organic light emitting diode display is manufactured by sealing a lower substrate, on which electronic devices such as an organic light emitting diode (OLED) and thin film transistors (TFTs) are disposed, with an encapsulation substrate. In addition to the encapsulation substrate, power lines for applying voltages to the TFTs and control signal lines for applying various control signals are formed in the organic light emitting diode display. Recently, various power lines and control signal lines are disposed on the encapsulation substrate.

However, in order to manufacture the encapsulation substrate on which the various lines are disposed, wiring portions are fabricated on the encapsulation substrate through plating followed by etching technique. Due to these complicated processes, fabrication costs increase. In addition, processing lines as such are limited to an encapsulation substrate for organic light emitting diode displays having a size of less than 26 inches, and thus, an encapsulation substrate for large organic light emitting diode displays having a size of 26 inches or greater may not be fabricated.

SUMMARY OF THE INVENTION

The present invention provides an encapsulation substrate for an organic light emitting diode display and a low cost and simple method of manufacturing the encapsulation substrate by fabricating wiring portions on the encapsulation substrate without performing plating or etching processes.

According to an aspect of the present invention, there is provided a method of manufacturing an encapsulation substrate for an organic light emitting diode display, including fabricating a composite panel by forming an uncured carbon fiber resin portion having a plate shape and including an upper surface and a lower surface and forming an uncured insulating resin portion arranged to surround edges of the carbon fiber resin portion, the uncured insulating resin portion being perforated by a plurality of penetration holes, inserting a plurality of conductive components into corresponding ones of the plurality of penetration holes, covering upper and lower surfaces of the composite panel with metal films and bonding the metal films to the composite panel while simultaneously curing the carbon fiber resin and the insulating resin portion by applying heat and pressure to the composite panel.

The method may also include, after the application of the heat and pressure, forming first and second metal film portions that are separated and electrically insulated from each other by cutting the metal films, the first metal film portion corresponding to portions of the composite panel where conductive components are arranged and the second metal film portion corresponding to a center portion of the composite panel. The method may also include, after the cutting of the metal films, removing the second metal film portion arranged on the upper surface of the composite panel. The insulating resin portion may include an adhesive component to bond the metal films to the composite panel upon said application of said heat and pressure. The method may also include, prior to the covering the upper and lower surfaces of the composite panel with metal films, attaching a conductive film onto a portion of the composite panel that include the conductive components inserted within the penetration holes.

In the applying of the heat and pressure, the composite panel may be heated to a temperature in a range of about 110° C. to about 140° C. and may be pressurized to a pressure in a range of 1 to 10 MPa. The carbon fiber resin portion may include an adhesive to bond the metal films to the composite panel upon said application of said heat and said pressure. The metal films may include a metal such as copper, silver and aluminum. The conductive components may be made out of copper, aluminum, indium tin oxide (ITO), and silver, and each of the conductive components may be either a snap-fastener, a block or a ⊏ -shaped conductive component.

According to another aspect of the present invention, there is provided a method of manufacturing an encapsulation substrate for an organic light emitting diode display, including fabricating a composite panel by forming an uncured carbon fiber resin portion having a plate shape including an upper surface and a lower surface, forming an uncured insulating resin portion arranged to surround edges of the carbon fiber resin portion, and curing the carbon fiber resin portion and the insulating resin portion, forming penetration holes in the cured insulating resin portion arranged at edges of the composite panel, inserting a plurality of conductive components into corresponding ones of the plurality of penetration holes, attaching bonding films to upper and lower surfaces of the composite panel, attaching metal films onto the upper and lower surfaces of the composite panel and bonding the metal films to the composite panel by applying heat and pressure to the composite panel.

The method may also include, after said application of said heat and pressure to bond the metal films, forming first and second portions of said metal films that are separated from each other and electrically insulated from each other by cutting the metal films, the first portion of the metal films corresponding to the conductive components and the second portion of the metal films corresponding to a central portion of the composite panel. The method may also include, after the cutting of the metal films, removing the second portion of the metal films arranged on the upper surface of the composite panel. The method may also include, prior to the attaching metal films onto the upper and lower surfaces of the composite panel, attaching a conductive film onto portions of the composite panel corresponding to the conductive components.

In said application of said heat and said pressure to the composite panel, the composite panel may be heated to a temperature in a range of about 110° C. to about 140° C. and may be pressurized to a pressure in a range of about 1 MPa to 10 MPa. The metal films may include at least one metal selected from a group consisting of copper, silver, and aluminum. The conductive components may be made out of one of copper, aluminum, indium tin oxide (ITO), and silver and take the form of one of a snap-fastener, a block and a ⊏-shaped type conductive component.

According to yet another aspect of the present invention, there is provided an encapsulation substrate that includes a composite panel that includes a carbon fiber resin portion having a plate shape and including an upper surface and a lower surface, and an insulating resin portion surrounding edges of the carbon fiber resin portion, a plurality of penetration holes perforating the insulating resin portion at edges of the composite panel, a plurality of conductive components arranged within corresponding ones of the plurality of penetration holes to electrically connect the upper and lower surfaces of the composite panel, each of the conductive components being one of a snap-fastener, a block and a ⊏-shaped conductive component, the conductive components being made out of one of copper, aluminum, indium tin oxide (ITO) and silver and a plurality of metal films including first portions covering portions of upper and lower surfaces of the composite panel at locations that correspond to where the conductive components are arranged and a second portion arranged on a lower surface of the composite panel and at a central portion of the composite panel, the second portion being separated from the first portions of the metal films, the plurality of metal films being made out of one of copper, silver and aluminum. The encapsulation substrate may also include a conductive film arranged between the conductive components and the first portions of the metal films.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 9 through 15 are cross-sectional views illustrating a method of manufacturing the encapsulation substrate according to a second embodiment of the present invention; and FIGS. 16 through 18 are cross-sectional views illustrating a method of manufacturing the encapsulation substrate according to a third embodiment of the present invention.

DETAILED DESCRIPTION OF THE INVENTION

Figure 1:
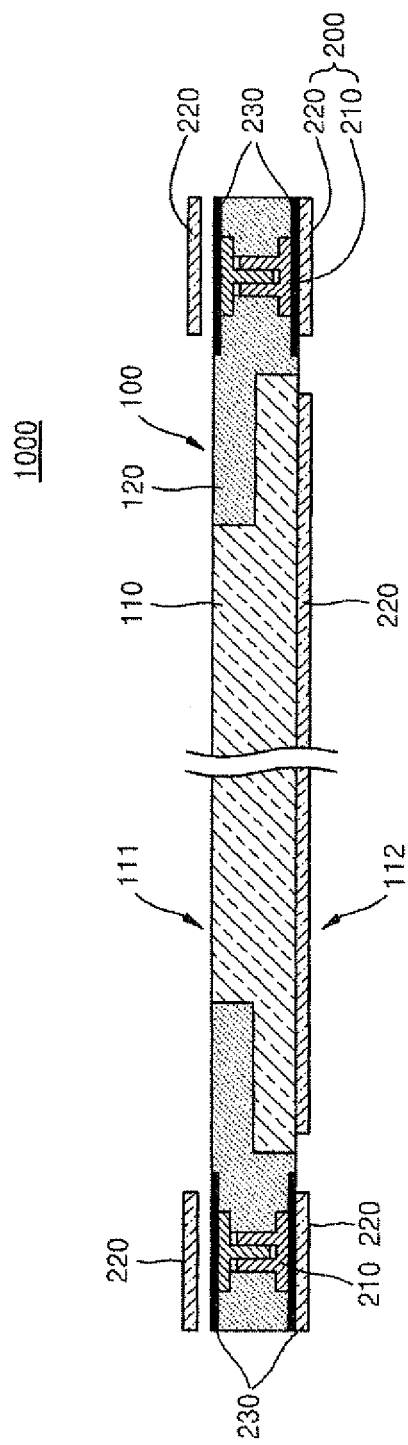
FIG. 1 is cross-sectional view of an encapsulation substrate for an organic light emitting diode display, according to an embodiment of the present invention.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, structures and operations of the present invention will be described with reference to embodiments of the present invention illustrated in accompanying drawings.

Turning now to FIG. 1, FIG. 1 is a cross-sectional view of an encapsulation substrate 1000 for an organic light emitting diode display, according to an embodiment of the present invention. Referring to FIG. 1, the encapsulation substrate 1000 for the organic light emitting diode display includes a composite panel 100 including a carbon fiber resin portion 110, an insulating resin portion 120 and a wiring portion 200 arranged in the composite panel 100. The wiring portion 200 includes a conductive component 210 and a metal film 220.

The composite panel 100 includes a carbon fiber resin portion 110 having a rectangular plate shape including an upper surface 111 and a lower surface 112. The carbon fiber resin portion 110 may be a resin matrix such as epoxy and a plurality of carbon fibers. The insulating resin portion 120 may be formed surrounding the edges of the carbon fiber resin portion 110. The insulating resin portion 120 contacting the carbon fiber resin portion 110 may be formed in a step structure. For example, in FIG. 1, the insulating resin portion 120 protrudes toward the upper surface 111 of the carbon fiber resin portion 110, however, the present invention is not limited thereto as insulating resin portion 120 may instead protrude toward the lower surface 112 of the carbon fiber resin portion 110 or may protrude toward both of the upper and lower surfaces 111 and 112. The insulating resin portion 120 may include an insulating polymer such as nylon or polyethylene terephthalate (PET), glass fibers, and a resin matrix such as epoxy.

Figure 4:
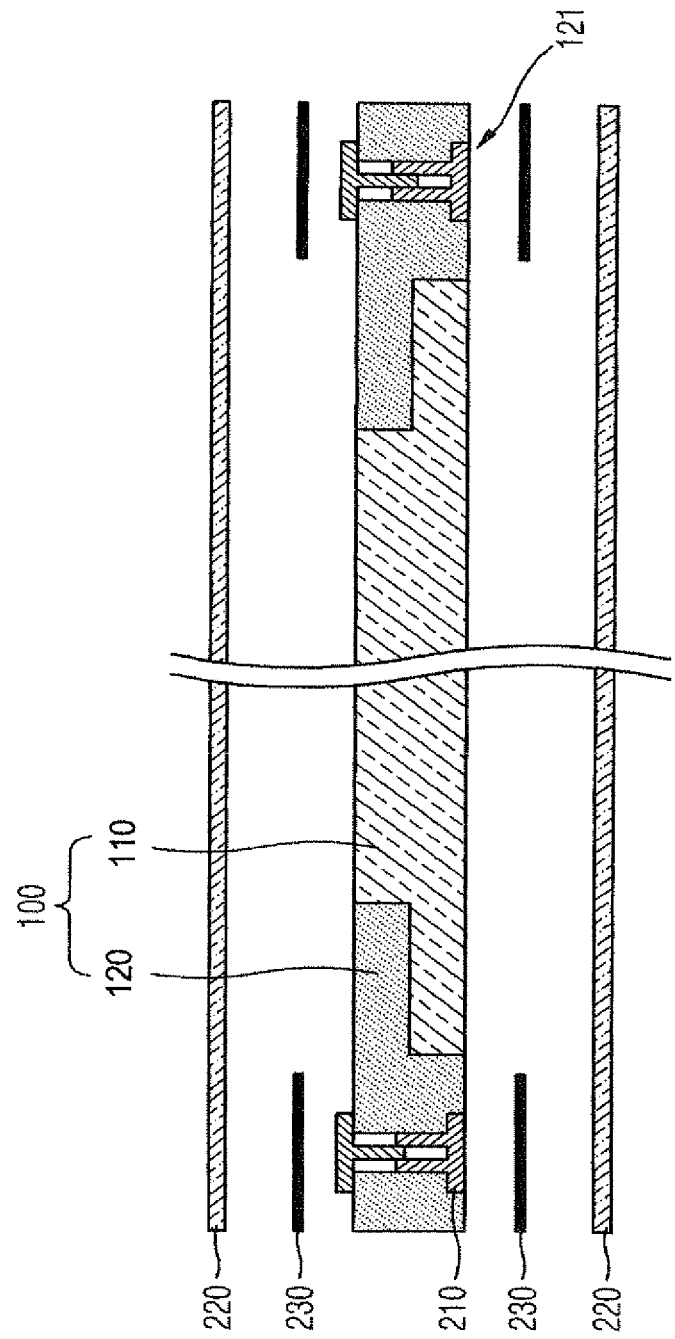
FIGS. 4 through 7 are cross-sectional views illustrating a method of manufacturing the encapsulation substrate of FIG. 1, according to a first embodiment of the present invention.

Perforating the insulating resin portion 120 arranged at the boundaries of the composite panel 100 are penetration holes 121 (see FIG. 4). The penetration holes 121 may be formed in each surface of the edges of the composite panel 100, and one or more penetration holes 121 may be formed in each surface. The conductive components 210 is inserted within the penetration holes 121.

The conductive component 210 is a part of the wiring portion 200, and electrically connects the upper and lower surfaces 111 and 112 of the composite panel 100. The conductive component 210 may be made out of copper, aluminum, indium tin oxide (ITO) or silver. The conductive component 210 may be a snap fastener, a block, or a ⊏-shaped conductive component. The conductive component 210 shown in FIG. 1 is a snap fastener conductive component. The snap fastener type conductive component 210 may be fabricated by a forging process, that is, when an upper component formed as a tack having a protrusion thread is inserted and pressed into a lower component formed as a tack having an insertion recess, the protrusion thread of the upper component being plastic-deformed to couple to the lower component.

Figure 2:
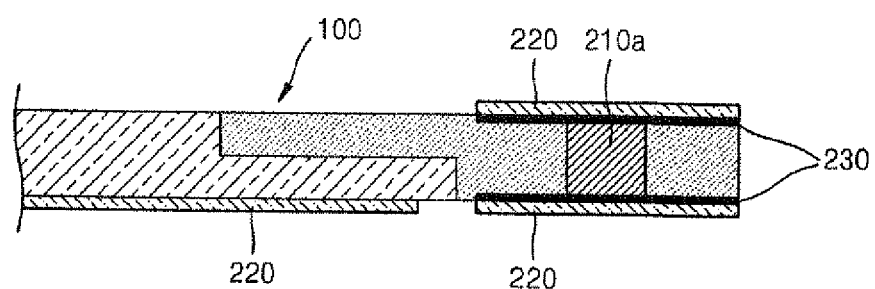
FIGS. 2 and 3 are cross-sectional views illustrating examples of conducting components used in the encapsulation substrate for the organic light emitting diode display.
Figure 3:
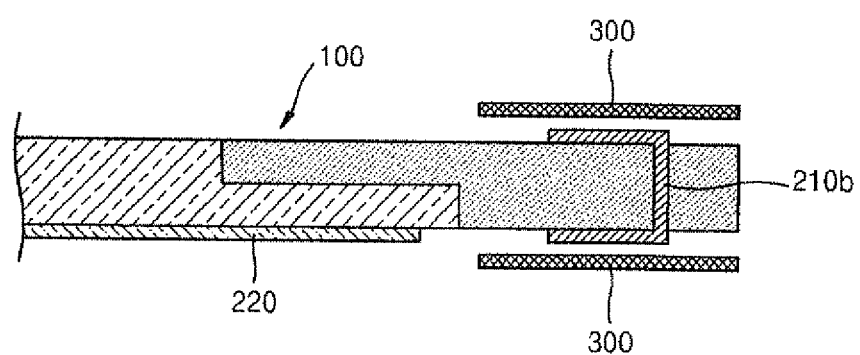

Turning now to FIGS. 2 and 3, FIGS. 2 and 3 show other examples of the conductive component 210. Referring now to FIG. 2, a block type conductive component 210a is shown. When the block type conductive component 210a is used, the plurality of penetration holes 121 formed in the surface of the composite panel 100 may be changed into a single elongated penetration hole 121. Thus, processes of forming the plurality of penetration holes 121 and disposing the conductive components 210 independently in each of the penetration holes 121 may be avoided.

Referring now to FIG. 3, a ⊏ -shaped conductive component 210b is shown. When the ⊏ -shaped conductive component 210b is used, the metal film 220 that covers a portion where the conductive component 210b is disposed is not necessary. In addition, a process for cutting the metal film 220 in order to insulate the portion in which the conductive component 210b is disposed from the other portions is not necessary. In addition, the conductive component 210b may be inserted firmly into the composite panel 100. In FIG. 3, a release film 300 may be included to fix the conductive component 210b into the composite panel 100.

The metal film 220 is a part of the wiring portion 200, and includes two portions separated from each other. One portion of metal film 220 covers the portion in which the conductive component 210 is arranged and the other portion is disposed on the lower surface 112 of the composite panel 100. The metal film 220 may be made out of one of copper, silver or aluminum. The metal film 220 and the conductive component 210 form the wiring portion 200 that receives a first power voltage ELVDD or a second power voltage ELVSS from an additional power unit and transfers the power voltage to a thin film transistor (TFT) arranged on a lower substrate (not shown). Although not shown in the drawings, the TFT arranged on the lower substrate may receive a power voltage from an additional power unit via a short-circuit portion (not shown) disposed between the encapsulation substrate 1000 and the lower substrate and a connecting portion (not shown) connecting the short-circuit unit to the TFT on the lower substrate.

Referring back to FIG. 1, the metal film 220 covers portions of the upper and lower surfaces 111 and 112 of the composite panel 100 where the conductive components 210 are disposed. In addition, another portion of metal film 220 covers the lower surface 112 of the composite panel 100 and is separated from the portions of metal film 220 covering the conductive components 210, however the present invention is not limited thereto as the metal film 220 may instead include a portion that covers the upper surface 111 of the composite panel 100 and is separated from the portions that cover the conductive components 210 (see FIG. 6). In FIG. 1, the conductive component 210 and the portion of the metal film 220 covering the conductive component 210 located at a left side may be the wiring portion 200 for transferring the first power voltage, and the conductive component 210 and the metal film 220 covering the conductive component 210 located at a right side may be the wiring portion 200 for transferring the second power voltage. In such an arrangement, when the upper surface 111 or the lower surface 112 of the composite panel 100 is covered by the single metal film 220, the first and second power voltages may be short-circuited. Therefore, the metal film 220 covers the lower surface 112 of the composite panel 100 so as to be separated from the portions of metal film 220 that cover conductive components 210.

The metal film 220 may attach to the composite panel 100 by an adhesive film, however the present invention is in no way so limited as the metal film 220 may be attached to the composite panel 100 by the application of heat and pressure. When heat and pressure are applied to the metal film 220 arranged on composite panel 200, the epoxy included in the carbon fiber resin portion 110 and the insulating resin portion 120 serve to bind the metal film 220 to the composite panel 100.

A conductive film 230 is disposed between the conductive component 210 and the metal film 220. The conductive film 230 bonds the metal film 220 to the conductive component 210, and at the same time electrically connects the metal film 220 to the conductive component 210. An anisotropic conductive film (ACF), in which conductive balls are infiltrated, may be used as the conductive film 230. Instead of using the conductive film 230, a fluidic adhesive in which conductive balls are distributed may be applied between the portion where the conductive component 210 is disposed and the metal film 220.

Turning now to FIGS. 4 through 7, FIGS. 4 through 7 are cross-sectional views illustrating a method of manufacturing the encapsulation substrate 1000 for an organic light emitting diode display according to a first embodiment of the present invention. Referring to FIG. 4, metal film 220 is deposited onto the composite panel 100 when the constituents of the composite panel, i.e., the carbon fiber resin portion 110 and the insulating resin portion 120 are in an uncured state. In more detail, an uncured carbon fiber resin portion 110 is formed as a plate having an upper surface 111 and a lower surface 112. An uncured insulating resin portion 120 perforated by penetration holes 121 is arranged to surround edges of the carbon fiber resin portion 110 to produce the composite panel 100.

The carbon fiber resin portion 110 may include a resin matrix such as epoxy and a plurality of carbon fibers. The epoxy included in the carbon fiber resin portion 110 serves as an adhesive that allows the metal film 220 to be attached to the composite panel 100 upon the curing of the carbon fiber resin portion 110. The carbon fiber resin portion 110 may be formed as a rectangular plate having upper and lower surfaces 111 and 112. Side surfaces of the carbon fiber resin portion 110 may have a step structure. The carbon fiber resin portion 110 may have a thickness of about 0.5 mm to about 1 mm. The carbon fiber resin portion 110 may have a coefficient of thermal expansion (CTE) that is equal to or slightly greater than that of the lower substrate of the organic light emitting diode display. Since the encapsulation substrate 1000 for the organic light emitting diode display includes the carbon fiber resin portion 110, the method of producing the encapsulation substrate 1000 may be simplified and a slim encapsulation substrate 1000 may be fabricated.

The insulating resin portion 120 may include a resin matrix such as epoxy and an insulating polymer such as nylon, PET or glass fiber. The epoxy included in the insulating resin portion 120 serves as an adhesive so that the metal film 220 may attach to the composite panel 100 upon the insulating resin portion 120 being cured. The insulating resin portion 120 may be formed surrounding the edges of the carbon fiber resin portion 110. When the side surfaces of the carbon fiber resin portion 110 have the step structure, side surfaces of the insulating resin portion 120 contacting the carbon fiber resin portion 110 may have a corresponding step structure. As with the carbon fiber resin portion 110, the insulating resin portion 120 may be formed to a thickness of about 0.5 mm to about 1 mm. Since the insulating resin portion 120 is included in the composite panel 100, electrical shorts do not occur on the edges of the composite panel 100. The penetration holes 121 are formed in the insulating resin portion 120 when the insulating resin that makes up the insulating resin portion 120 is in an uncured state. Since the insulating resin portion 120 is in an uncured state, the penetration holes 121 may be formed easily, and thus an additional process of forming penetration holes in a cured insulating resin may be avoided. As a result, cracks or burr that may be generated when penetration holes are formed in a cured insulating resin are avoided.

Referring now to FIG. 4, the conductive component 210 is disposed in each of the penetration holes 121 formed in the insulating resin portion 120 of the composite panel 100, and metal films 220 are formed to cover the upper and lower surfaces 111 and 112 of the composite panel 100. The process of disposing the conductive component 210 within the penetration holes 121 and attaching the metal films 220 may be performed simultaneously with the formation of the composite panel 100.

The conductive component 210 and the metal film 220 make up the wiring unit 200. The conductive component 210 and the metal film 220 receive the first and second power voltages from an additional power unit (not shown) and transfer the first and second power voltages to the TFT formed on the lower substrate. Therefore, the conductive component 210 and the metal film 220 are made out of a conductive material. In more detail, the conductive component 210 may include one or more of copper, aluminum, ITO, and silver. The metal film 220 may include one or more metals among copper, silver, and aluminum.

The conductive component 210 is one of a snap-fastener, a block, or a ⊏-shaped conductive component and is inserted into the penetration hole 121. The metal film 220 is disposed covering the upper surface 111, including the portion in which the conductive component 210 is disposed and the entire lower surface 112 of the composite panel 100. The metal film 220 may be formed to a thickness of about 5 μm to about 30 μm.

Before covering the upper and lower surfaces 111 and 112 of the composite panel 100 by using the metal film 220, the conductive film 230 may be further disposed on portions of composite panel 100 in a vicinity of each of the conductive components 210 arranged within the penetration holes 121, so that the conductive film will ultimately be arranged between the conductive component 210 and the metal film 220. The conductive film 230 serves to bond the metal film 220 to the conductive component 210, and at the same time electrically connects the metal film 220 to the conductive component 210. The conductive film 230 may have a thickness of about 5 μm to about 30 μm. The conductive film 230 may be an ACF in which the conductive balls are infiltrated. Alternatively, instead of using the conductive film 230, a fluidic adhesive in which the conductive balls are distributed may be applied in the vicinity of each of the conductive components 210 arranged within the penetration holes 121 so that the fluidic adhesive containing the conductive balls can be arranged between the conductive component 210 and the metal film 220.

Figure 5:
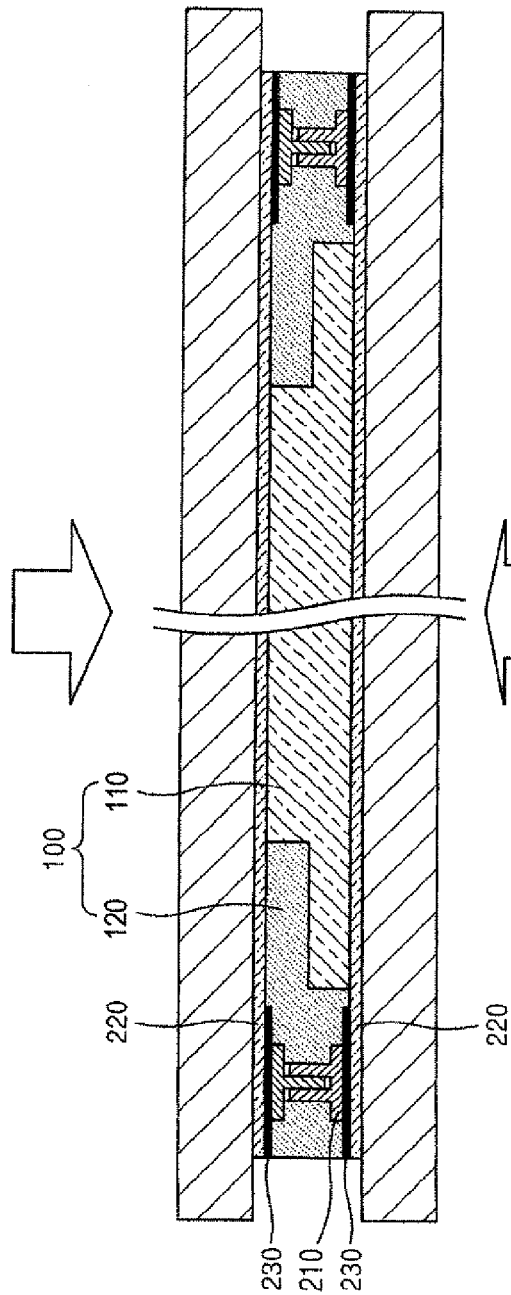

Referring now to FIG. 5, heat and pressure are applied to the composite panel 100 which is covered by the metal film 220. The metal film 220 is bonded to the composite panel due to the heat and pressure being applied while the carbon fiber resin portion 110 and the insulating resin portion 120 are cured. In addition, the conductive component 210 is fixed in the composite panel 100. The temperature of the heat applied to the composite panel 100 covered with the metal film 220 is about 110° C. to about 140° C. If heat lower than 110° C. is applied to the composite panel 100, the efficiency of attaching and fixing the metal film 220 onto the composite panel 100 is sharply reduced. In addition, if heat higher than 140° C. is applied to the composite panel 100, the composite panel 100 may be damaged due to the high temperature. Thus, heat of about 125° C., for example, may be applied to the composite panel 100. Simultaneous to the application of heat, a pressure of about 1 to 10 MPa, which is ten to a hundred times greater than an atmospheric pressure, is applied to the composite panel 100 covered with the metal film 220. The pressure is applied in a direction from the metal film 220 toward the composite panel 100. If less than 1 MPa is applied to the metal film 220 on the composite panel 100, the efficiency of attaching and fixing the metal film 220 is sharply reduced. In addition, if pressure that is greater than 10 MPa is applied to the metal film 220 on the composite panel 100, the composite panel 100 and the metal film 220 are damaged.

According to the present embodiment, the composite panel 100 is cured by heat and pressure while the metal film 220 is attached or laminated. In this process, the epoxy included in the uncured carbon fiber resin portion 110 and the uncured insulating resin portion 120 functions as an adhesive to attach the metal film 220 to the composite panel 100, and thus, a process of applying a separate adhesive or an adhesive film to attach the metal film 220 to composite panel 100 is not necessary. Therefore, processes may be simplified, and the metal film 220 and the conductive component 210 corresponding to the wiring portion 200 may be formed without having to perform a plating followed by an etching process. In addition, since the insulating resin portion 120 corresponding to the conductive component 210 also includes epoxy which is likely to be the adhesive, the conductive component 210 and the metal film 220 may be directly adhered to each other.

Figure 6:
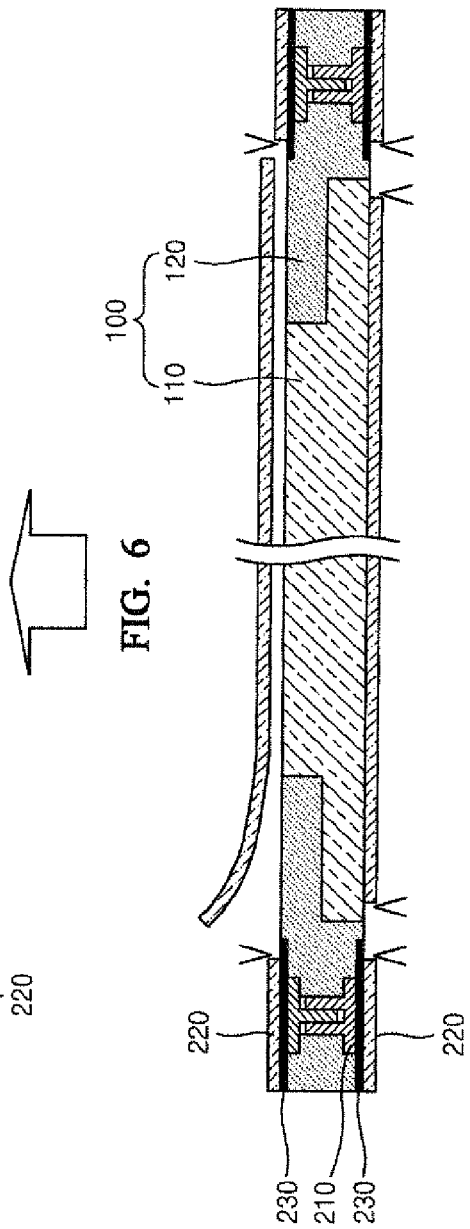

Referring now to FIG. 6, after laminating the metal film 220, the metal film 220 is cut so that the portions of metal film 220 where the conductive component 210 are disposed and portions of metal film 220 corresponding to a central portion of composite panel 100 may be separated and electrically insulated from each other. As illustrated in FIG. 6, four portions of metal film 220 are cut from composite panel 100, but the present invention is not limited thereto as additional cuts can be made and still be within the scope of the present invention. In FIG. 6, the conductive component 210 located at the left side and the conductive component 210 located at the right side may transfer the power voltages that are different from each other. When this happens, if the upper surface 111 or the lower surface 112 of the composite panel 100 is covered by a single metal film 220, the different power voltages may be shorted together. To prevent this from happening, the metal film 220 is cut so that the portions of metal film 220 covering the conductive components 210 and the portions of metal film 220 covering the central portion of composite panel 100 may be separated and electrically insulated from each other.

Figure 7:
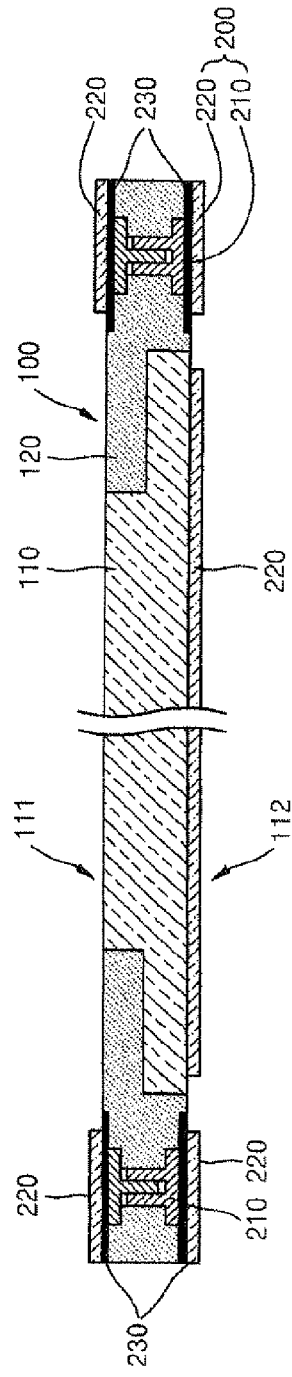
Figure 8:
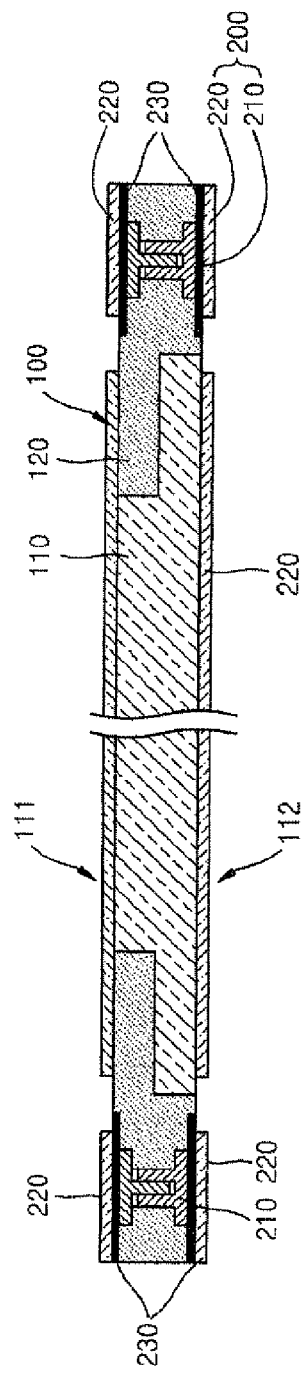
FIG. 8 is a cross-sectional view of an encapsulation substrate for an organic light emitting diode display according to another embodiment of the present invention.

Referring now to FIG. 7, after cutting the metal film 220, the metal film 220 that covers the upper surface 111 of the composite panel 100, except for the portion where the conductive components 210 are disposed, is removed to complete the manufacture of the encapsulation substrate 1000. However, the present invention is not limited thereto, and as shown in FIG. 8, the metal film 220 covering the upper surface 111 of the composite panel 100 may remain. In FIG. 8, since the metal film 220 covering the upper surface 111 remains, bending of the encapsulation substrate 1000 may be prevented.

According to the present embodiment, the wiring portion 200 of the encapsulation substrate 1000 may be fabricated in a simple manner by formation of the conductive component 210 and lamination of the metal film 220, without performing chemical processes such as plating and etching, and thus, fabrication yield may be improved and fabrication costs may be reduced. In particular, since the uncured carbon fiber resin portion 110 and the uncured insulating resin portion 120 are formed to fabricate the composite panel 100, the process of forming the penetration holes 121 after the process of curing the insulating resin portion 120 may be omitted. According to the present embodiment, the uncured carbon fiber resin portion 110 and the uncured insulating resin portion 120 may be cured at the same time.

Turning now to FIGS. 9 through 15, FIGS. 9 through 15 are cross-sectional views illustrating a method of manufacturing the encapsulation substrate 1000 for an organic light emitting diode display according to a second embodiment of the present invention. According to the first embodiment illustrated in FIGS. 4 through 7, the components forming the wiring portion 200 are disposed on the uncured composite panel 100, and the lamination of the metal film 220 and the curing of the composite panel 100 are performed simultaneously. On the other hand, according to the second embodiment illustrated in FIGS. 9 through 15, the composite panel 100 is formed and cured separately, and after that, components forming the wiring portion 200 are disposed and the lamination of the metal film 220 is performed. Therefore, some processes may be added or changed as compared to the first embodiment illustrated in FIGS. 4 through 7, and these added and changed processes will be described hereinafter, but processes the same as those of the previous embodiment will not be described.

Figure 9:
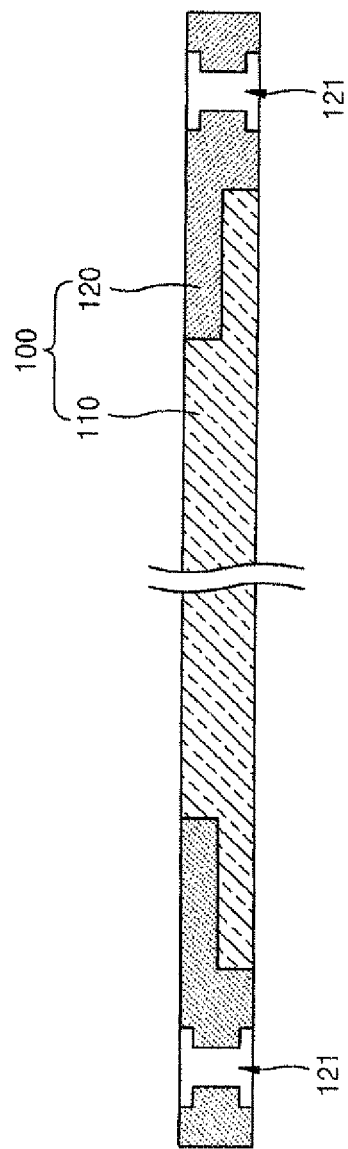

Referring now to FIG. 9, the uncured carbon fiber resin portion 110 is formed as a plate including the upper surface 111 and the lower surface 112, and the uncured insulating resin portion 120 is formed surrounding the edges of the carbon fiber resin portion 110. After that, the carbon fiber resin portion 110 and the insulating resin portion 120 are cured to fabricate the composite panel 100. Here, the carbon fiber resin portion 110 and the insulating resin portion 120 may be cured by heat. The shapes, materials, and thicknesses of the carbon fiber resin portion 110 and the insulating resin portion 120 are described with reference to FIG. 4, and thus detailed descriptions thereof are not provided here.

As shown in FIG. 9, the penetration holes 121 are formed in the cured insulating resin portion 120 located at the edges of the composite panel 100, however, the present invention is not limited thereto, as penetration holes 121 may instead be formed in an uncured insulating resin portion 120 and the insulation resin portion may then be cured to avoid forming penetration holes in a cured material.

Figure 10:
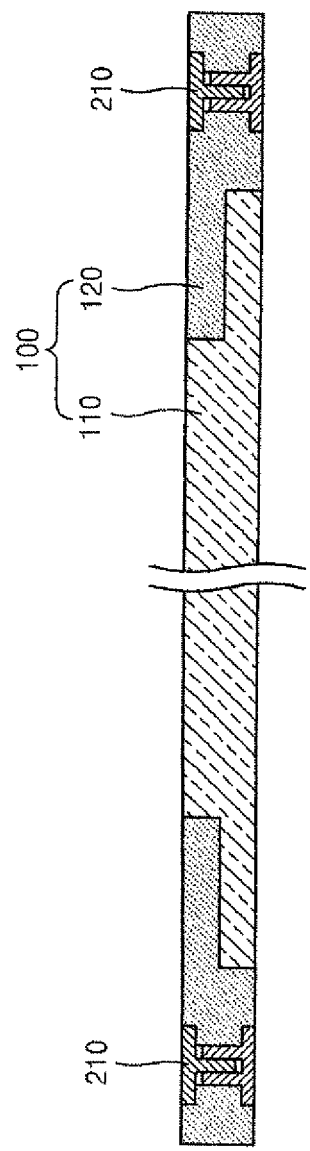

Referring now to FIG. 10, the conductive component 210 is disposed in each of the penetration holes 121. FIG. 10 shows the snap-fastener type conductive component 210, however, as described with reference to FIGS. 1 through 3, the conductive component 210 may instead be formed in various other shapes. In addition, functions and materials of the conductive component 210 are described above, and thus, descriptions thereof are not provided here.

Figure 11:
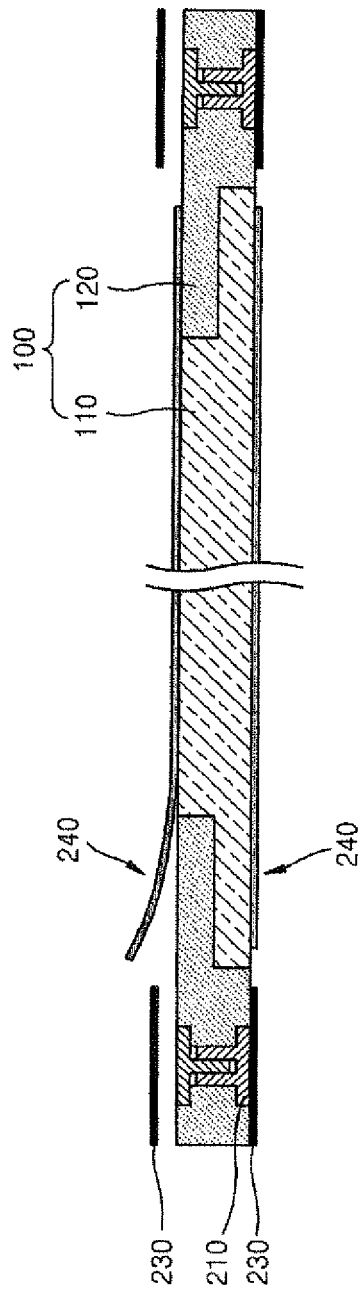

Referring now to FIG. 11, bonding films 240 are attached to the upper and lower surfaces 111 and 112 of the composite panel 100. This process is not performed in the first embodiment illustrated in FIGS. 4 through 7. Since the composite panel 100 is already cured as described with reference to FIG. 9, an additional bonding film 240 is necessary to bond the metal film 220 to the composite panel 100. The bonding film 240 may include an epoxy resin, an acrylic resin, a polyurethane resin, or cellulose ether. The bonding film 240 bonds the metal film 220 to the composite panel 100 while being cured by heat, and may be formed of a material having a low curing temperature. If a material having a high curing temperature is used as the bonding film 240, a bending phenomenon may occur after bonding the metal film 220. The bonding film 240 may attach to the composite panel 100, except for the portion where the conductive component 210 is disposed. In the portion where the conductive component 210 is disposed, conductive film 230 may be disposed. As a result, the conductive film 230 will ultimately be disposed between the conductive component 210 and the metal film 220. The conductive film 230 bonds the metal film 220 to the conductive component 210, and at the same time, electrically connects the metal film 220 to the conductive component 210. The kinds and thickness of the conductive film 230 are described above.

Figure 12:
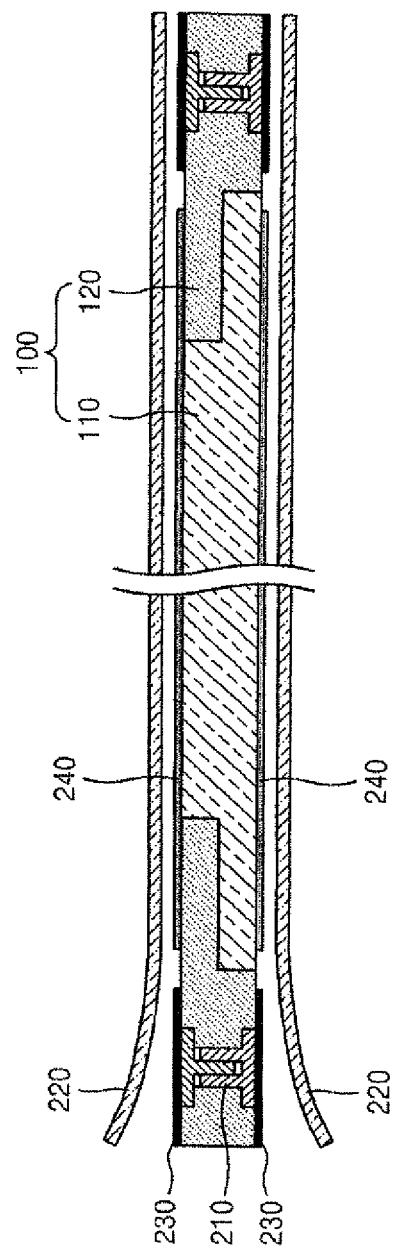

Referring now to FIG. 12, metal films 220 covers upper and lower surfaces 111 and 112 of the composite panel 100. In more detail, the composite panel 100 and the metal films 220 are bonded to each other by disposing the bonding film 240 and the conductive film 230 therebetween. Here, the metal films 220 may cover the entire upper surface 111 of the composite panel 100 and the entire lower surface 112 of the composite panel 100.

Figure 13:
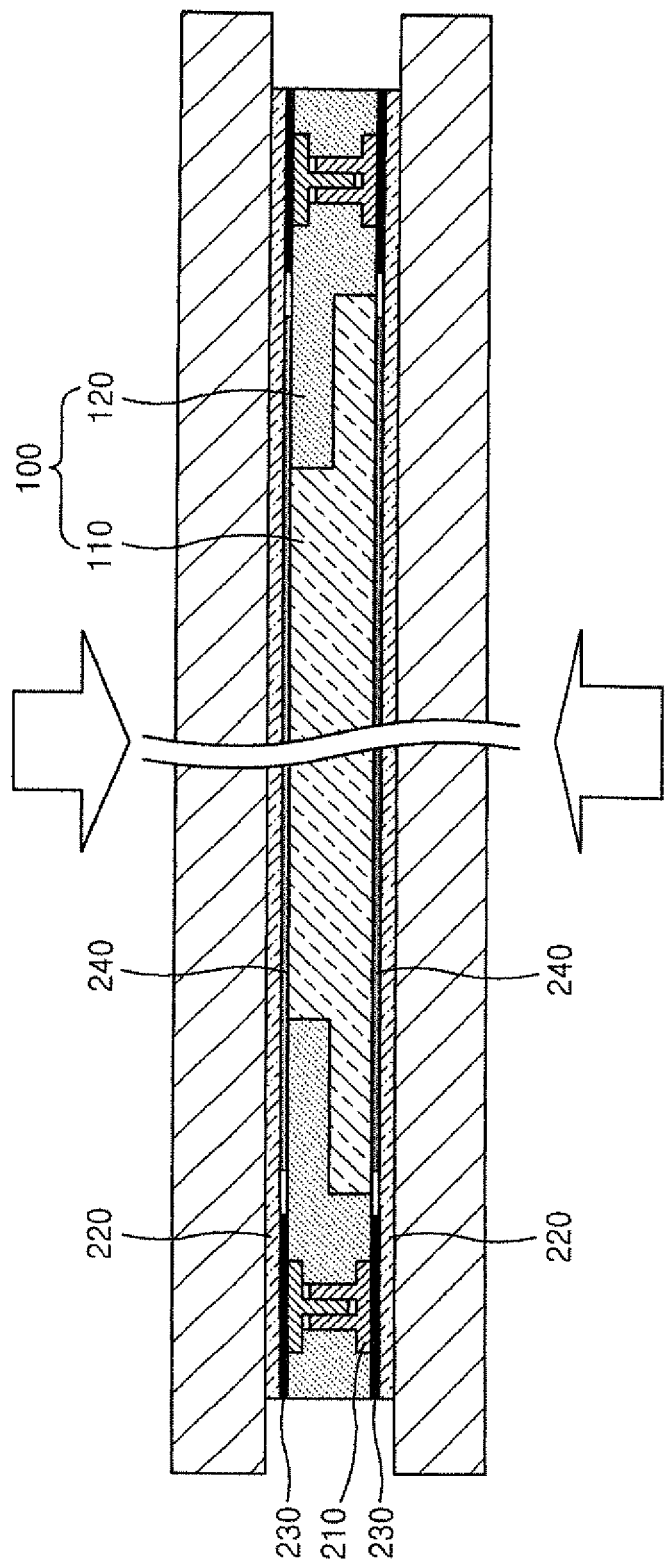

Referring now to FIG. 13, heat and pressure are simultaneously applied to the composite panel 100 covered with the metal films 220 so that the metal films 220 may be laminated. Here, heat of about 110° C. to about 140° C. is applied to the composite panel 100 covered with the metal films 220. If heat lower than 110° C. is applied to the composite panel 100, the efficiency of attaching and fixing the metal films 220 to the composite panel 100 is sharply reduced. In addition, if heat higher than 140° C. is applied to the composite panel 100, the composite panel 100 may be damaged due to the high temperature. Thus, heat of about 125° C. may be applied to the composite panel 100. While the heat is being applied, a pressure that is 1 to 10 MPa is also applied to the composite panel 100 covered with the metal films 220 in a direction from the metal films 220 toward the composite panel 100. If pressure less than 1 MPa is applied to the composite panel 100, the efficiency of attaching and fixing the metal film 220 is sharply reduced. In addition, if pressure greater than 10 MPa is applied to the composite panel 100, the composite panel 100 and the metal film 220 are damaged.

Referring now to FIG. 14, after laminating the metal film 220 to the composite panel 100, the metal film 220 is cut so that the metal film 220 covering the portions where the conductive components 210 are disposed and the metal film 220 covering the central portion may be separated and electrically insulated from each other. In FIG. 6, four portions of the metal film 220 are cut so that the portions where the conductive components 210 are disposed and the central portions are separated from each other, however the present invention is not limited thereto, and as shown in FIGS. 14 and 15, the metal film 220 disposed on the upper surface 111 of the composite panel 100 may have additional cuts if necessary. The cutting may be determined according to the design of the wiring portion 200.

Referring now to FIG. 15, after cutting the metal film 220, a portion of the metal film 220 covering a central portion of the upper surface 111 of the composite panel 100 may be removed, however the present invention is not limited thereto as the metal film 220 may instead be removed except for a part of the metal film 220 covering the upper surface 111 of the composite panel 100.

Figure 16:
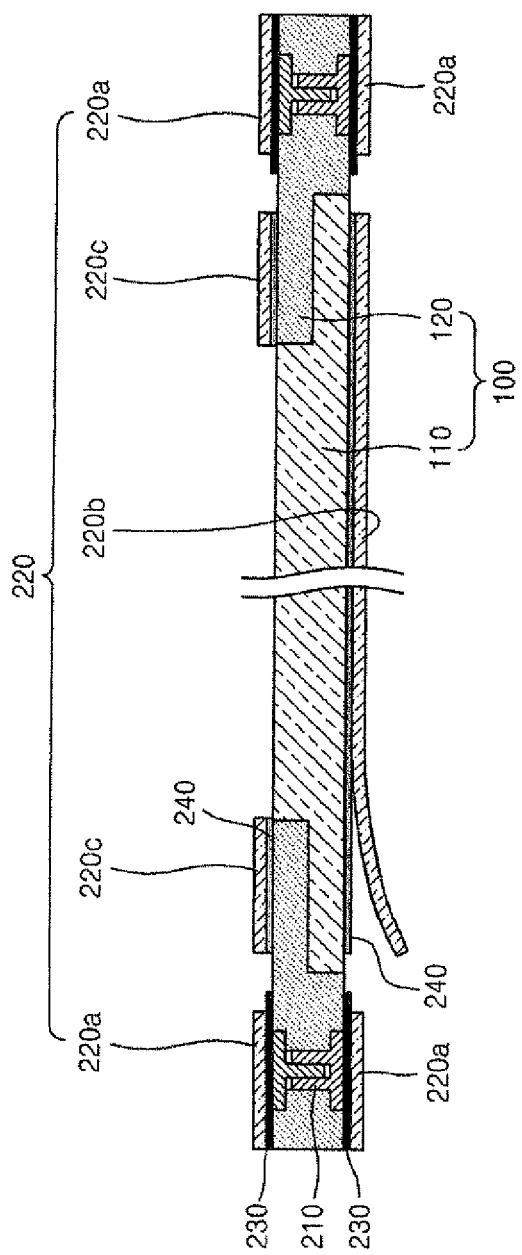

Turning now to FIGS. 16 through 18, FIGS. 16 through 18 are cross-sectional views illustrating a method of manufacturing the encapsulation substrate 1000 for an organic light emitting diode display according to a third embodiment of the present invention. Processes illustrated in FIGS. 16 through 18 are performed after the processes illustrated in FIGS. 9 through 11 have been performed and instead of the processes illustrated in FIGS. 12 through 15.

Referring now to FIG. 16, FIG. 16 illustrates the process of attaching an already cut and patterned metal film 220 to the composite panel 100. In FIG. 16, the metal film 220 covers the upper and lower surfaces 111 and 112 of the composite panel 100. Here, the metal film 220 may be divided into a plurality of pieces. For example, the metal film 220 may include metal film portions 220a covering the portions where the conductive components 210 are disposed, a metal film portion 220b covering the lower surface 112 of the composite panel 100 except for the portion where the conductive components 210 are disposed, and a metal film portion 220c covering a part of the upper surface 111 of the composite panel 100 except for the portion where the conductive components 210 are disposed. When the metal films 220a, 220b, and 220c, which are cut and patterned, are used as shown in FIG. 16, the process of cutting the metal film 220 while the metal film is on the composite panel 100 as illustrated in FIGS. 6 and 14 may be omitted. In other words, unlike the methods of FIGS. 4 through 7 and FIGS. 9 through 15, in the method of FIGS. 16 through 18, the patterned metal film 220 (including 220a, 220b, and 220c) is produced by cutting a large metal film prior to the large metal film being attached to the composite panel 100.

Referring now to FIG. 17, heat and pressure are applied to the composite panel 100 covered with the metal film 220 so as to laminate the metal film 220 to form the completed encapsulation substrate 1000 of FIG. 18. Unlike the method of FIGS. 9 through 15, the method of FIGS. 16 through 18 avoids having to cut and pattern the metal film 220 while the metal film 220 is attached to the composite panel 100.

In the present invention, the encapsulation substrate 1000 is used in an organic light emitting diode display, however, the encapsulation substrate 1000 of the present invention is not limited thereto may be applied to various flat panel displays, for example, liquid crystal displays (LCDs), plasma displays, and the like.

According to the method of manufacturing an encapsulation substrate for an organic light emitting diode display of the present invention, a wiring portion is fabricated by using a metal film and a conductive component on a composite panel formed of a carbon fiber resin portion and an insulating resin portion, and thus, the encapsulation substrate, in which the wiring portion is integrally formed, may be fabricated.

In particular, the wiring portion may be fabricated by inserting the conductive components in penetration holes or laminating the metal film without performing complicated processes such as etching and plating processes. Thus, large-size organic light emitting devices, that is, 26 inches or greater, which are difficult to fabricate using conventional etching and plating techniques, may be manufactured quick and easy at low fabrication costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting diode display, the method comprising:
fabricating a composite panel by forming an uncured carbon fiber resin portion having a plate shape and including an upper surface and a lower surface and forming an uncured insulating resin portion arranged to surround edges of the carbon fiber resir portion, the uncured insulating resin portion being perforated by a plurality of penetration holes;
inserting a plurality of conductive components into corresponding ones of the plurality of penetration holes;
covering upper and lower surfaces of the composite panel with metal films;
producing an encapsulating substrate by bonding the metal films to the composite panel while simultaneously curing the carbon fiber resin portion and the insulating resin portion by applying heat and pressure to the composite panel; and
encapsulating an organic light emitting diode with the encapsulation substrate.

2. The method of claim 1, further comprising, after the application of the heat and pressure, forming first and second metal film portions that are separated and electrically insulated from each other by cutting the metal films, the first metal film portion corresponding to portions of the composite panel where conductive components are arranged and the second metal film portion corresponding to a center portion of the composite panel.

3. The method of claim 2, further comprising, after the cutting of the metal films, removing the second metal film portion arranged on the upper surface of the composite panel.

4. The method of claim 1, wherein the insulating resin portion comprises an adhesive component to bond the metal films to the composite panel upon said application of said heat and pressure.

5. The method of claim 1, further comprising, prior to the covering the upper and lower surfaces of the composite panel with metal films, attaching a conductive film onto a portion of the composite panel that include the conductive components inserted within the penetration holes.

6. The method of claim 1, wherein, in the applying of the heat and pressure, the composite panel is heated to a temperature in a range of about 110° C. to about 140° C. and is pressurized to a pressure in a range of 1 to 10 MPa.

7. The method of claim 1, wherein the carbon fiber resin portion comprises an adhesive to bond the metal films to the composite panel upon said application of said heat and said pressure.

8. The method of claim 1, wherein the metal films comprise a metal selected from a group consisting of copper, silver and aluminum.

9. The method of claim 1, wherein the conductive components comprise a material selected from a group consisting of copper, aluminum, indium tin oxide (ITO), and silver, each of the conductive components being an element selected from a group consisting of a snap-fastener, a block and a ⊏ -shaped conductive component.

10. The method of claim 1, wherein the carbon fiber resin portion comprises an epoxy that serves to attach and bond the metal films to the composite panel upon the curing of the carbon fiber resin portion.

11. The method of claim 1, wherein the insulating resin portion comprises an epoxy that serves to attach and bond the metal films to the insulating resin portion upon the curing of the insulating resin portion.

12. The method of claim 1, wherein the metal films are bonded directly to the carbon fiber resin portion on the upper and lower surfaces of the composite panel.

13. The method of claim 1, wherein the insulating resin portion is arranged only to surround edges of the carbon fiber resin portion.

14. The method of claim 1, wherein the penetration holes are arranged only external to the edges of the carbon fiber resin portion and are external to the carbon fiber resin portion.

15. The method of claim 1, wherein the upper and lower surfaces of the composite panel are composed of:
   the upper and lower surfaces of the carbon fiber resin portion; and
   upper and lower surfaces respectively of the insulating resin portion.

16. The method of claim 1, wherein in the covering of the upper and lower surfaces of the composite panel with the metal films, the metal films are arranged on the conductive components arranged within the penetration holes.

17. The method of claim 16, further comprising a conductive film arranged between each of the conductive components and each of the metal films to bond the metal films to the conductive components when the metal films are bonded to the composite panel.

18. The method of claim 1, wherein the carbon fiber resin portion has a same thickness as the insulating resin portion.

19. The method of claim 1, wherein the metal films are bonded directly to portions of the insulating resin portion on the upper and lower surfaces of the composite panel.

20. The method of claim 1, wherein the composite panel comprises only a single carbon fiber resin portion, the single carbon fiber resin portion corresponding to a central portion of the composite panel.

\* \* \* \* \*